United States Patent
Schultz

(10) Patent No.: US 6,851,098 B2
(45) Date of Patent: Feb. 1, 2005

(54) STATIC TIMING ANALYSIS AND PERFORMANCE DIAGNOSTIC DISPLAY TOOL

(75) Inventor: Richard Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 258 days.

(21) Appl. No.: 10/232,423

(22) Filed: Aug. 28, 2002

(65) Prior Publication Data

US 2004/0044976 A1 Mar. 4, 2004

(51) Int. Cl.⁷ .............................................. G06F 17/50
(52) U.S. Cl. .................................... 716/6; 716/4; 716/5
(58) Field of Search ..................................... 716/6, 4, 5

(56) References Cited

U.S. PATENT DOCUMENTS

| | | | | | |
|---|---|---|---|---|---|
| 5,095,454 | A | * | 3/1992 | Huang | 703/19 |
| 6,195,788 | B1 | * | 2/2001 | Leaver et al. | 716/18 |
| 6,427,226 | B1 | * | 7/2002 | Mallick et al. | 716/10 |
| 6,658,635 | B1 | * | 12/2003 | Tanimoto | 716/6 |

* cited by examiner

*Primary Examiner*—Vuthe Siek
*Assistant Examiner*—Sun James Lin
(74) *Attorney, Agent, or Firm*—Cochran, Freund & Young

(57) ABSTRACT

Static timing analysis results from multiple corner cases are combined to create a differential results table that may be used to identify components that are a high risk for failure. These results may be combined with a schematic analysis tool that finds overlapping logic cones for specific nodes of a circuit such as a failing output pin. These tools are specifically adapted to assist an engineer in the design and debugging of complex circuits, such as integrated circuits.

7 Claims, 7 Drawing Sheets

First Corner Case Results

| Node | Hold | Setup | Reset | Pulse Width |
|---|---|---|---|---|
| 602 | 150 | 122 | 289 | |
| 604 | | | | 600 |
| 606 | | | | 620 |
| 608 | | | | 400 |
| 610 | 160 | 154 | 290 | |
| 612 | 59 | 45 | 250 | |
| 614 | | | | 5200 |
| 616 | | | | 5200 |

Figure 7A

Second Corner Case Results

| Node | Hold | Setup | Reset | Pulse Width |
|---|---|---|---|---|
| 602 | 122 | 102 | 209 | |
| 604 | | | | 400 |
| 606 | | | | 420 |
| 608 | | | | 300 |
| 610 | 145 | 132 | 220 | |
| 612 | 32 | 15 | 230 | |
| 614 | | | | 5000 |
| 616 | | | | 5000 |

Figure 7B

Differential Between First and Second Corner Cases

| Node | Hold | Setup | Reset | Pulse Width |
|---|---|---|---|---|
| 602 | 28 | 20 | 80 | |
| 604 | | | | 200 |
| 606 | | | | 200 |
| 608 | | | | 100 |
| 610 | 15 | 22 | 70 | |
| 612 | 27 | 30 | 20 | |
| 614 | | | | 200 |
| 616 | | | | 200 |

Figure 7C

Percentage Difference Between Corner Cases

| Node | Hold | Setup | Reset | Pulse Width |
|---|---|---|---|---|
| 602 | 19% | 16% | 28% | |
| 604 | | | | 33% |
| 606 | | | | 32% |
| 608 | | | | 25% |
| 610 | 9% | 14% | 24% | |
| 612 | 46% | 67% | 8% | |
| 614 | | | | 4% |
| 616 | | | | 4% |

Figure 7D

STATIC TIMING ANALYSIS AND PERFORMANCE DIAGNOSTIC DISPLAY TOOL

BACKGROUND OF THE INVENTION a. Field of the Invention

The present invention pertains to tools used to analyze integrated circuits during design and failure analysis and specifically to combining multiple static timing analyses and displaying the results in a useful manner.

b. Description of the Background

Integrated circuits (IC's) are extremely complex and contain an enormous number of components or cells. As the size of these components decreases, even more components can be manufactured on a single IC. The complexity of the IC's makes debugging an IC difficult and very labor intensive. Further, the sheer number of components, sometimes in the millions, may make pinpointing a problem area an enormous task.

Static timing analysis is a common method for finding problem areas of an IC during the design phase. The circuitry is simulated to determine if it meets the desired functionality. Generally, the static timing analysis can be run for several corner cases, such as high and low temperature, high and low voltages, and various processing conditions. As a check of the performance of the design prior to fabrication, many or all of the corner cases may be run and the design adjusted until all the corner cases pass. Even though the design passes all of the corner cases, a typical design will still have some problem areas that may need to be adjusted after the IC is fabricated for the first time.

It would therefore be advantageous to provide a system and method for identifying problem areas within a design prior to releasing the design to fabrication. It would further be advantageous to provide a system and method for identifying marginal problems with circuit timing, determining potential problem areas, and displaying those components with potential problems for further testing and analysis.

SUMMARY OF THE INVENTION

The present invention overcomes the disadvantages and limitations of the prior art by providing a system and method for determining components that may be potential problems in a design based on analysis of multiple static timing analyses. Specifically, those nodes with large degrees of change between corner cases are identified as potential problems. Further, potential problem areas within a circuit may be defined through intersecting logic cones and the results of the multiple static timing analyses displayed within the context of the intersecting logic cones.

The present invention may therefore comprise a method of analyzing an integrated circuit comprising: identifying a plurality of corner cases; performing a static timing analysis and generating a static timing analysis dataset for each of the plurality of corner cases; calculating at least one multipass dataset based on determining the differences between the plurality of datasets from the static timing analysis; determining the set of particular nodes for which results are to be displayed; and displaying at least a portion of the multipass dataset for at least a portion of the set of particular nodes.

The present invention may further comprise a method of analyzing an integrated circuit comprising: identifying a plurality of corner cases; performing a static timing analysis and generating a static timing analysis dataset for each of the plurality of corner cases; creating a multipass dataset based on determining the differences between the plurality of datasets from the static timing analysis by finding the maximum value of a specific node from the plurality of the static timing analysis datasets, finding the minimum value of the specific node from the plurality of the static timing analysis datasets, calculating the difference between the maximum value and the minimum value, saving the difference in the multipass dataset, and repeating the aforesaid four steps for each node in the datasets; and displaying the multipass dataset.

The present invention may further comprise an integrated circuit designed with the process comprising: creating a schematic representation of the integrated circuit; identifying a plurality of corner cases; performing a static timing analysis and generating a static timing analysis dataset for each of the plurality of corner cases; creating a multipass dataset based on determining the differences between the plurality of datasets from the static timing analysis by finding the maximum value of a specific node from the plurality of the static timing analysis datasets, finding the minimum value of the specific node from the plurality of the static timing analysis datasets, calculating the difference between the maximum value and the minimum value, saving the difference in the multipass dataset, and repeating the aforesaid four steps for each node in the datasets; displaying the multipass dataset; identifying at least one marginal node of the schematic to change based in part on the multipass dataset; and making at least one change to the schematic representation to effect a change the marginal node.

The advantages of the present invention are that marginal nodes in a design can be identified that may be different from problem nodes normally identified with static timing analysis. The identified nodes are particularly susceptible to problems in temperature, voltage, and processing variations and may be likely candidates for failures. During debugging, searches through hundreds of thousands of nodes may be automated to assist an engineer in identifying potential areas for investigation, minimizing the number of probe points necessary to isolate a failure. Manual tracking of schematic and waveforms during root cause debugging can be eliminated, as well as the errors associated with manual methods.

BRIEF DESCRIPTION OF THE DRAWINGS

In the drawings,

FIG. 7A is a representation of a set of first corner case analysis results of a static timing analysis for the schematic of FIG. 6.

FIG. 7B is a representation of a set of second corner case analysis results of a static timing analysis for the schematic of FIG. 6.

FIG. 7C is a representation of a set of magnitude differences between the first corner case of FIG. 7A and the second corner case of FIG. 7B.

FIG. 7D is a representation of a set of percentage differences between the first corner case of FIG. 7A and the second corner case of FIG. 7B.

DETAILED DESCRIPTION OF THE INVENTION

Figure 1:
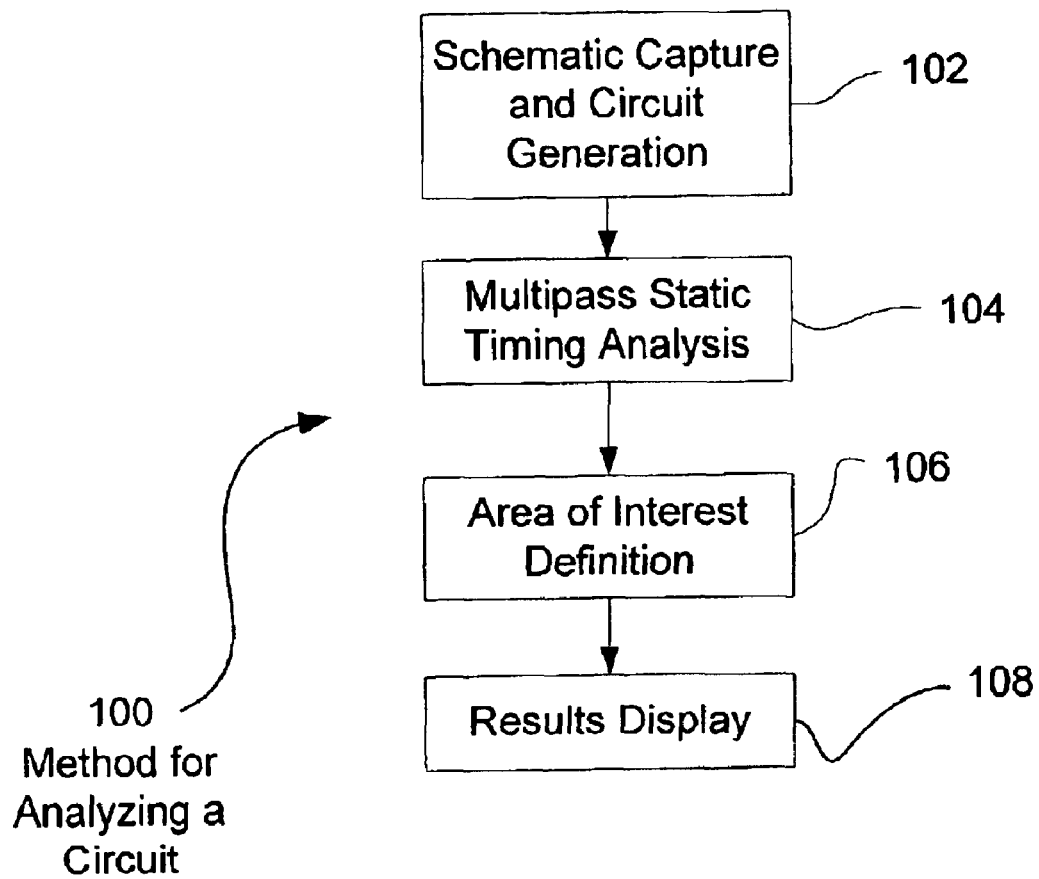
FIG. 1 is an illustration of an embodiment of a method for analyzing a circuit, such as a complex integrated circuit (IC).

FIG. 1 illustrates an embodiment of a method 100 for analyzing a circuit, such as a complex integrated circuit (IC). The schematic capture and circuit generation in step 102 is performed followed by a multipass static timing analysis in step 104, definition of an area of interest in step 106, and displaying the results in step 108.

The schematic capture and circuit generation in step 102 may be performed using conventional design tools well known in the art. The output of such tools may be used as an input to static timing analysis tools that are also well known in the art. Such tools may be incorporated into a single application or may be separate applications that communicate using a standard file protocol.

The multipass static timing analysis in step 104 performs static timing analysis on several corner cases, then finds those nodes or components that are most effected by the change in corner cases. For example, those components whose performance is most changed from a high temperature analysis to a low temperature analysis may be likely to become a problem when the circuit is fabricated into a silicon chip.

The static timing analysis results may include values such as set up, hold time, rise/fall times and pulse width checks for each node of a circuit. These values may be calculated for several corner cases of processing, temperature, and voltage. The datasets for each corner case may be compared to create several datasets that have the change in value from one corner case to another corner case. These datasets created from multiple corner cases may offer a different and useful perspective in identifying those nodes that may be potential failure points.

Definition of an area of interest in step 106 comprises manually or automatically determining those nodes that may be a problem during a debugging exercise. Logic cones may be defined by establishing a point in the schematic and tracing the connecting logic upstream or downstream from that point. A typical point may be an output pin of an IC that has a problem. In order to locate a potential problem, the logic cones of two or more pins with a similar problem may overlap in an area that may have problem circuitry.

The results are displayed in step 108. The results may include the area of interest defined in step 106 with the analysis of step 104. The results may be done graphically or in tabular form.

The multipass static timing analysis results may be displayed using the schematic display tool. The path of interest may be displayed based on the margin or change in margin using the static timing analysis results and displayed with the results graphically. If simulation vectors are available, the waveforms may be displayed on the schematic path and the worst case timing may be examined.

The schematic capture and circuit generation step 102 may be performed over a series of weeks or months. The multipass static timing analysis of step 104 may be performed at one time or may be performed on an on-going basis during the development of the circuit design. When a design is released to manufacturing, the multipass static analysis may be stored. The area of interest definition of step 106 and display of step 108 may occur at a later period when an engineer is debugging the fabricated circuit. The process of defining an area of interest and displaying the results may occur repeatedly during the debugging phase.

Figure 2:
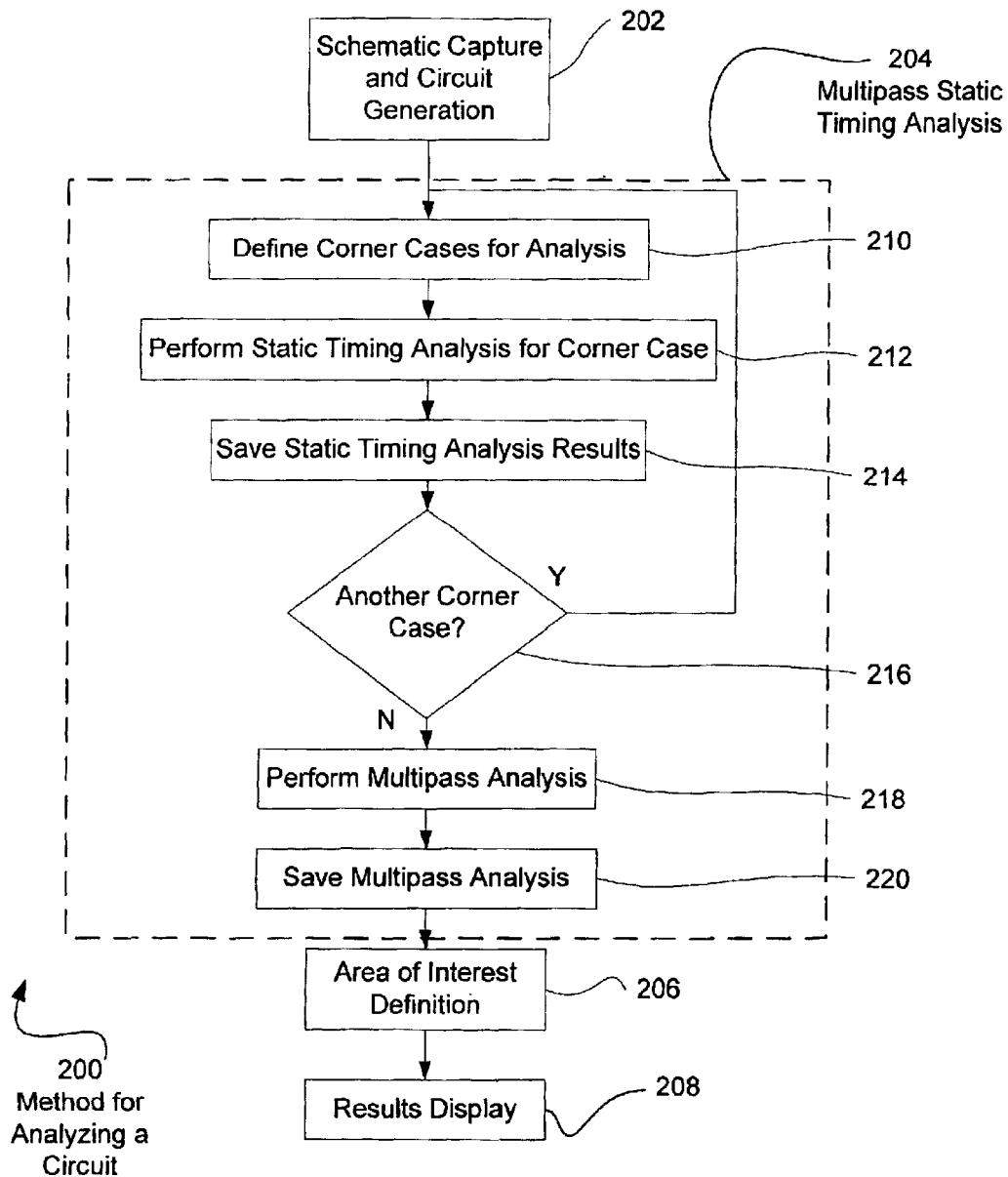
FIG. 2 is an illustration of an embodiment of the present invention for a method for analyzing a circuit, with a more detailed embodiment of the multipass static timing analysis.

FIG. 2 illustrates an embodiment 200 for a method for analyzing a circuit, with a more detailed embodiment of the multipass static timing analysis. The schematic capture and circuit generation in step 202 is input into the multipass timing analysis of step 204, followed by an area of interest definition of step 206 and the results display of step 208.

The multipass timing analysis of step 204 comprises defining all of the corner cases for analysis in step 210, performing the static timing analysis for a particular corner case in step 212, saving the results in step 214, and running another corner case in step 216. If the corner cases are completed in step 216, a multipass analysis is performed in step 218 and saved in step 220.

The multipass analysis of step 218 comprises comparing the results of the various corner cases to generate the change in values from one corner case to another. Those components or nodes with high differences may indicate that they are particularly susceptible to potential problems. For example, if a device has a margin of 250 ns in one process, voltage, and temperature simulation, but has a margin of 5 ns in a second simulation, there is reason to believe that the component may be a point of failure when the IC is fabricated, as it is particularly susceptible to the variations used in the simulation.

Figure 3:
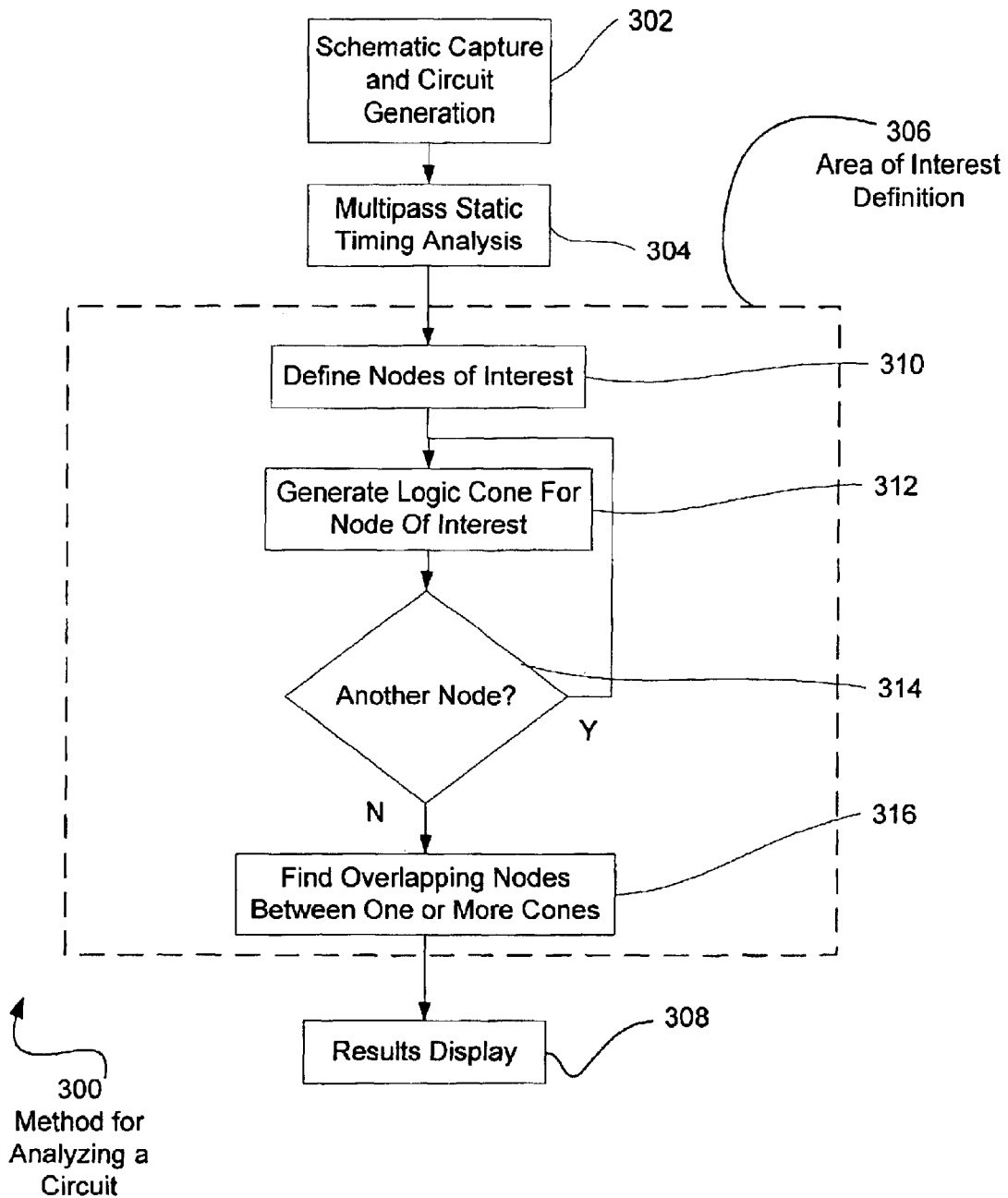
FIG. 3 is an illustration of an embodiment of the present invention for a method for analyzing a circuit, with a more detailed embodiment of the area of interest definition.

FIG. 3 illustrates an embodiment 300 for a method for analyzing a circuit, with a more detailed embodiment of the area of interest definition. The schematic capture and circuit generation in step 302 is input into the multipass timing analysis of step 304, followed by an area of interest definition of step 306 and the results display of step 308.

The area of interest definition 306 comprises defining the nodes of interest in step 310, generating a logic cone for the particular node of interest in step 312, repeating the process if more nodes need processing in step 314. If all the nodes are processed in step 314, those nodes that overlap more than one logic cone are identified in step 316. The overlapping nodes are used to display the results.

The concept and discussion of logic cones is described in the U.S. patent application Ser. No. 09/680,893 filed Oct. 6, 2000 by Richard Schultz entitled "Method of Automatically Generating Schematic and Waveform Diagrams for Analysis of Timing Margins and Signal Skews of Relevant Logic Cells using Input Signal Predicators and Transition Times", now U.S. Pat. No. 6,442,741, which is hereby incorporated by reference for all it discloses and teaches.

A node of interest of step 310 may be an output pin or input pin on an IC that exhibits a problem. In general, the node of interest is a point in the circuitry may be a place where a measurement may be taken such as a pin going into the IC. In some cases, the node of interest may be a specific point within the IC that is not directly measurable.

The logic cones may be generated as a partial net list of the schematic. When all of the logic cones are generated for the nodes of interest, those nodes that are common to two or more logic cones may be identified. In some embodiments, only those nodes that are common to all of the logic cones may be identified. In other embodiments, common nodes may be classified into groups of nodes that are common to only two logic cones, three logic cones, and so forth. A classification of nodes may assist an engineer in prioritizing nodes to investigate.

Figure 4:
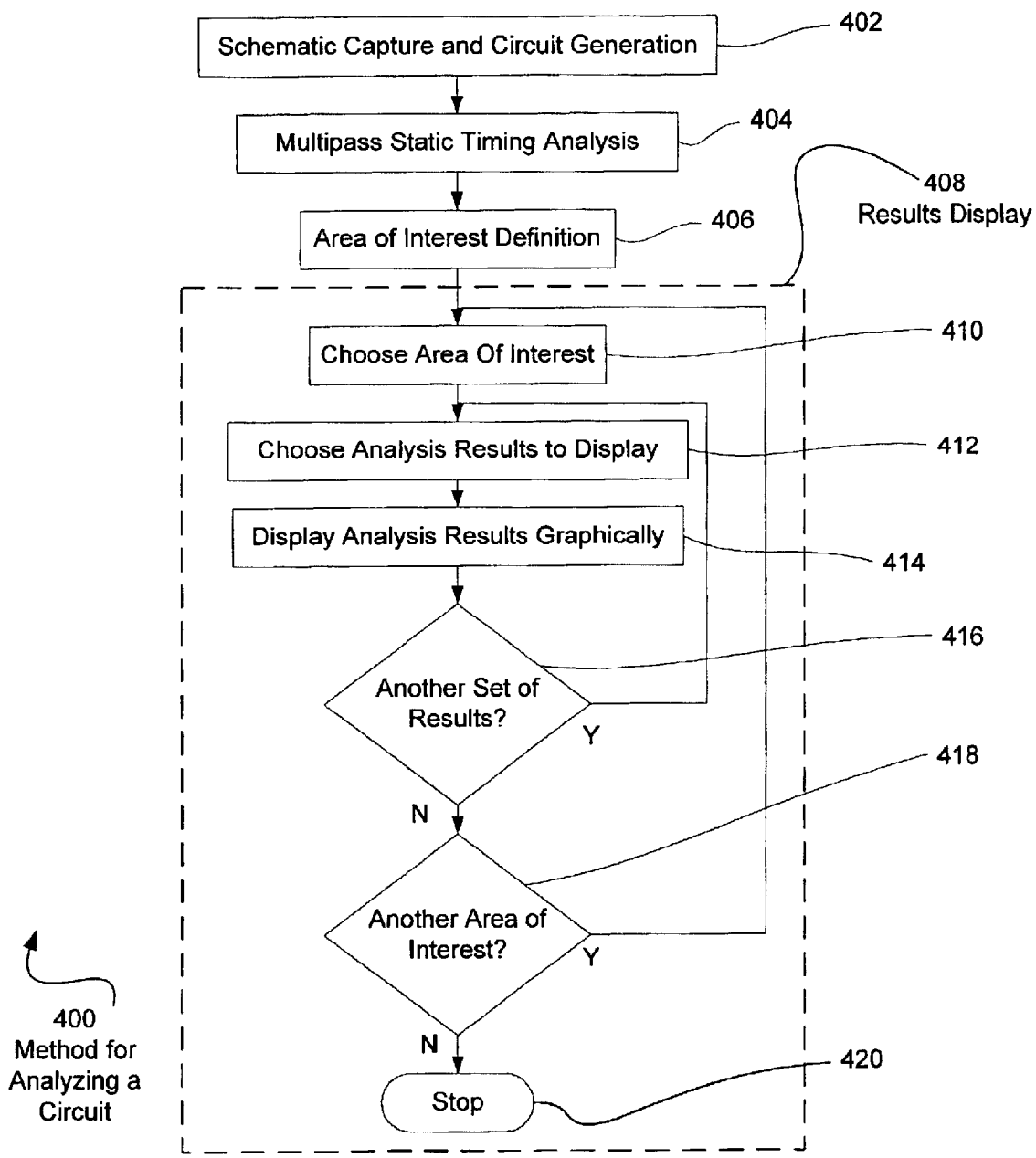
FIG. 4 is an illustration of an embodiment of the present invention for a method for analyzing a circuit, with a more detailed embodiment of the area of interest definition.

FIG. 4 illustrates an embodiment 400 of the present invention for a method for analyzing a circuit, with a more detailed embodiment of the area of interest definition. The schematic capture and circuit generation in step 402 is input into the multipass timing analysis of step 404, followed by an area of interest definition of step 406 and the results display of step 408.

The results display of step 408 comprises choosing an area of interest in step 410, choosing the results analysis to display in step 412 and displaying the results graphically in step 414. If another set of results is requested for the area of interest in step 416, the step 412 of choosing results to display is executed. If no more results are requested in step 416, another area of interest may be desired in step 418 and the step 410 of choosing an area of interest is repeated. In no other areas of interest are desired in step 418, the process terminates in step 420.

The results display of step 408 may be performed at different times. For example, when the IC design is completed and sent to the foundry for fabrication, the steps 402 and 404 of generating the schematic and multipass static timing analysis may be performed. Several days or weeks later during the debugging phase of the IC, steps 406 and 408 of choosing an area of interest and displaying the results may be performed.

In some embodiments, a portion of the schematic may be displayed with those nodes of interest found by overlapping logic cones may be highlighted in a special color. For example, those nodes that are common to all of the logic cones may be identified in red so that the user may quickly identify those particular nodes.

Figure 5:
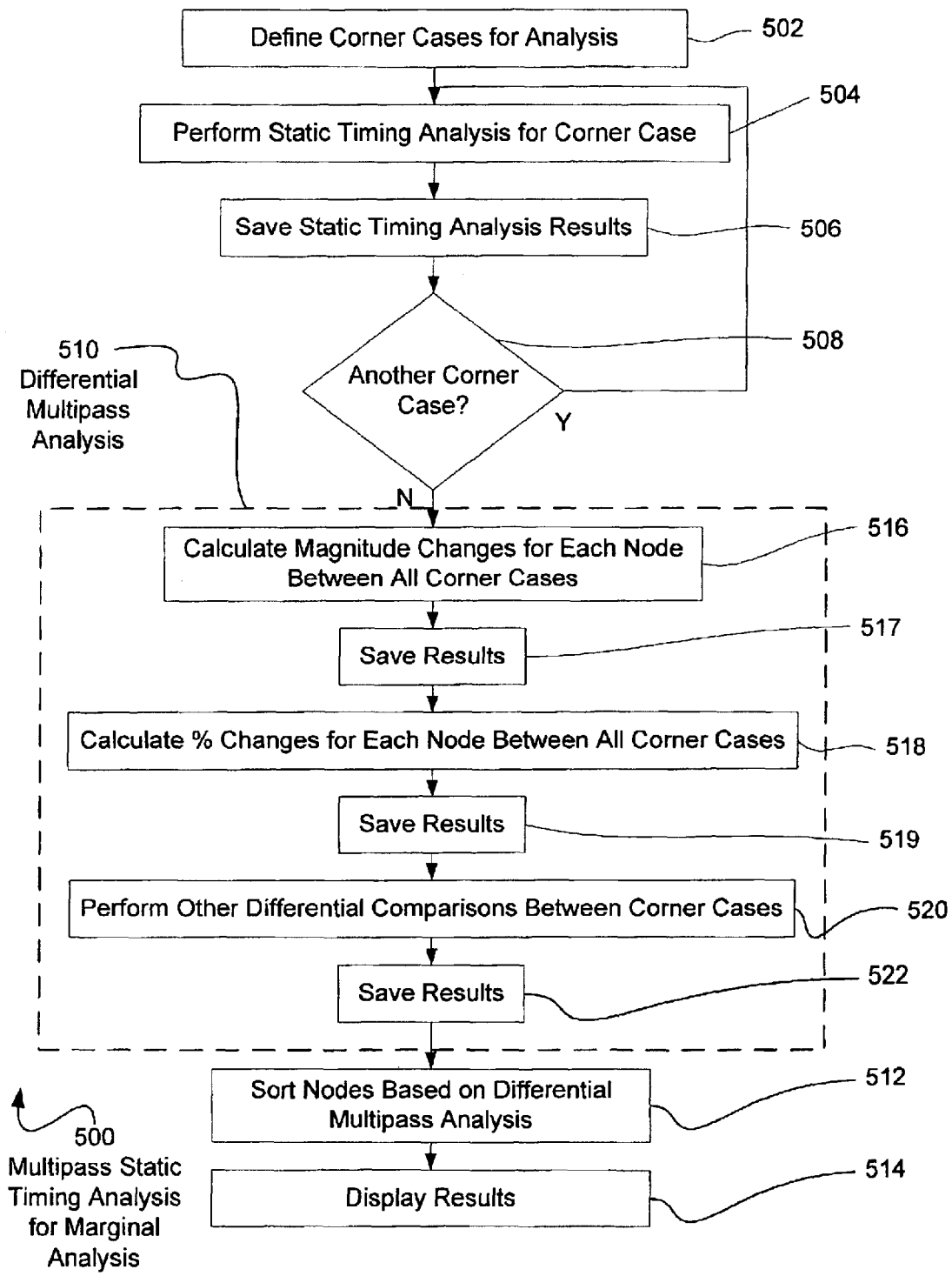
FIG. 5 is an illustration of an embodiment of the present invention for a method of using multipass static timing analysis for marginal analysis.

FIG. 5 illustrates an embodiment 500 of the present invention for a method of using multipass static timing analysis for marginal analysis. The corner cases for static timing analysis is defined in step 502, then the static timing analysis is performed in step 504 and saved in step 506. If more corner cases are needed in step 508, other static timing analyses may be run. The differential multipass analysis is performed in step 510, then the nodes are sorted in step 512 and the results displayed 514.

The differential multipass analysis 510 comprises calculating the magnitude changes for each node between all corner cases in step 516 and saving the results in step 517, calculating the percentage differences for each node between all corner cases in step 518 and saving the results in step 519, and other differential comparisons between all corner cases in step 520 and saving the results in step 522.

The results for each corner case of the static timing analysis may comprise one or more results values, such as a timing delay, for each node in the circuit. As several corner cases are analyzed, several datasets are generated, providing different results values for the particular nodes. The differential analysis 510 compares the multiple corner case analysis and creates additional calculated datasets.

The calculated datasets may be manipulated and displayed with the same tools and techniques as the corner case analysis datasets. For example, the standard display techniques of existing static timing analysis tools may be used to display the differential analysis datasets.

Many different calculated datasets may be developed by those skilled in the art. For example, the magnitude of change from one corner case to another corner case may be used to identify potentially suspect nodes. In other embodiments, the percentage change may also be used.

The calculated results may be sorted and analyzed as part of a design check prior to manufacturing. For example, those nodes with the highest percentage change may be investigated and adjusted prior to sending the IC to manufacturing. In other examples, those nodes with the greatest magnitude of change between two corner cases may be flagged as potential problems. In such a use, the multipass static timing analysis may be used as a stand alone tool for identifying potential problems within an IC design.

Figure 6:
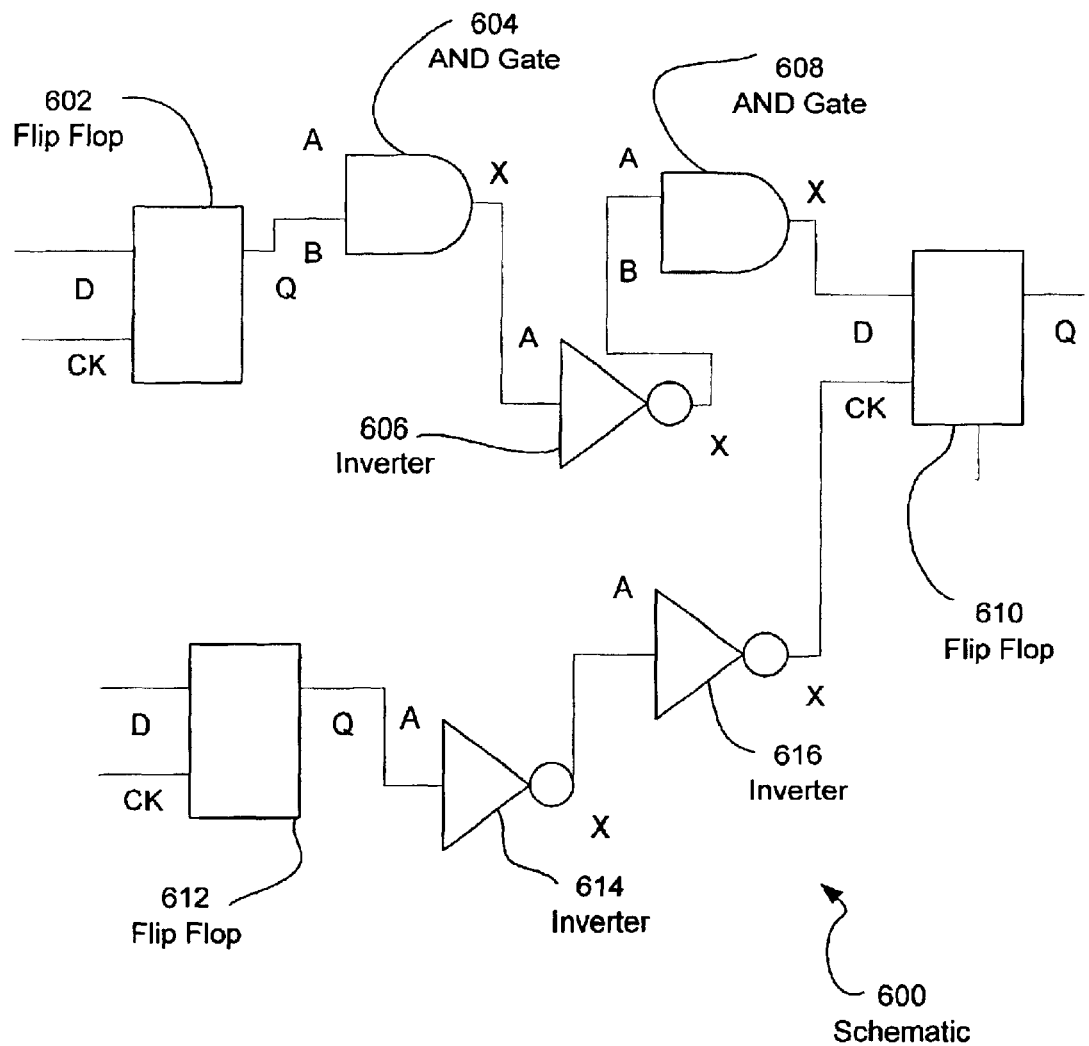
FIG. 6 is an illustration of an example of the use of the present invention of highlighting a component with a high risk of failure.

FIG. 6 illustrates an example of the use of the present invention of highlighting a component with a high risk of failure. A portion of a schematic 600 contains a flip flop 602 connected to an AND gate 604, an inverter 606, a second AND gate 608, and a second flip flop 610. A third flip flop 612 is connected to an inverter 614, another inverter 616, and the flip flop 610.

FIG. 7A represents a set of first corner case analysis results of a static timing analysis for the schematic 600. The nodes 602 through 616 correspond to the components 602 through 616 of schematic 600. The values shown are in picoseconds.

FIG. 7B represents a set of second corner case analysis results of a static timing analysis for the schematic 600. The nodes 602 through 616 correspond to the components 602 through 616 of schematic 600.

FIG. 7C represents a set of magnitude differences between the first corner case of FIG. 7A and the second corner case of FIG. 7B.

FIG. 7D represents a set of percentage differences between the first corner case of FIG. 7A and the second corner case of FIG. 7B.

In FIGS. 7A and 7B, flip flop 612 has the shortest hold time and shortest setup time. However, both values are positive, indicating that the device may function properly in the present schematic.

In FIG. 7C, the flip flops 602 and 610 have a high magnitude of change in the reset function, but much less change in the setup and hold time. This may indicate an avenue to the debugging engineer to explore potential problems. More examination of the causes of the change in reset performance may be warranted.

In FIG. 7D, the flip flop 612 has a very high percentage (67%) change in setup time. The sensitivity of the flip flop 612 between corner cases may indicate that the flip flop 612 is a high risk device for failure.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of analyzing an integrated circuit comprising:
identifying a plurality of corner cases;
performing a static timing analysis and generating a static timing analysis dataset for each of said plurality of corner cases;

calculating at least one multipass dataset based on determining the differences between said plurality of datasets from said static timing analysis;

determining a set of particular nodes for which results are to be displayed comprising the process of:

defining a plurality of nodes of interest;

generating a logic cone for each of said plurality of nodes of interest; and determining at least one node that overlaps at least two of said logic cones;

displaying at least a portion of said multipass dataset for at least a portion of said set of particular nodes.

2. The method of claim 1 wherein said step of generating a logic cone for each of said plurality of nodes of interest comprises:

creating a set of nodes for a logic cone;

adding said node of interest to said set of nodes; and recursively finding for each node within said set of nodes connecting nodes that connect to said node of interest, and adding said connecting nodes to said set of nodes.

3. A method of analyzing an integrated circuit comprising:

identifying a plurality of corner cases;

performing a static timing analysis and generating a static timing analysis dataset for each of said plurality of corner cases;

calculating at least one multipass dataset based on determining the differences between said plurality of datasets from said static timing analysis comprising the process of:

finding the maximum value of a specific node from the plurality of said static timing analysis datasets;

finding the minimum value of said specific node from said plurality of said static timing analysis datasets;

calculating a difference between said maximum value and said minimum value;

saving said differences in said multipass dataset; and repeating the aforesaid four steps for each node in said datasets;

determining a set of particular nodes for which results are to be displayed; and displaying at least a portion of said multipass dataset for at least a portion of said set of particular nodes.

4. A method of analyzing an integrated circuit comprising:

identifying a plurality of corner cases;

performing a static timing analysis and generating a static timing analysis dataset for each of said plurality of corner cases;

calculating at least one multipass dataset based on determining the differences between plurality of datasets from said static timing analysis comprising the process of:

finding the maximum value of a specific node from the plurality of said static timing analysis datasets;

finding the minimum value of said specific node from said plurality of said static timing analysis datasets;

calculating a percentage difference between said minimum value and said maximum value;

saving said differences in said multipass dataset;

repeating the aforesaid four steps for each node in said datasets;

determining a set of particular nodes for which results are to be displayed; and displaying at least a portion of said multipass dataset for at least a portion of said set of particular nodes.

5. A method of analyzing an integrated circuit comprising:

identifying a plurality of corner cases;

performing a static timing analysis and generating a static timing analysis dataset for each of said plurality of corner cases;

creating a multipass dataset based on determining the differences between said plurality of datasets from said static timing analysis by finding the maximum value of a specific node from the plurality of said static timing analysis datasets, finding the minimum value of said specific node from said plurality of said static timing analysis datasets, calculating a difference between said maximum value and said minimum value, saving said difference in said multipass dataset, and repeating the aforesaid four steps for each node in said datasets; and displaying said multipass dataset.

6. The method of claim 5 wherein said step of displaying said multipass dataset comprises:

determining the set of particular nodes for which results are to be displayed by defining a plurality of nodes of interest, generating a logic cone for each of said plurality of nodes of interest by creating a set of nodes for a logic cone, adding said node of interest to said set of nodes, and recursively finding for each node within said set of nodes connecting nodes that connect to said node of interest, and adding said connecting nodes to said set of nodes, determining at least one node that overlaps at least two of said logic cones; and displaying at least a portion of said multipass dataset for at least a portion of said set of particular nodes.

7. An integrated circuit designed in accordance with a process comprising:

creating a schematic representation of said integrated circuit;

identifying a plurality of corner cases;

performing a static timing analysis and generating a static timing analysis dataset for each of said plurality of corner cases;

creating a multipass dataset based on determining the differences between said plurality of datasets from said static timing analysis by finding the maximum value of a specific node from the plurality of said static timing analysis datasets, finding the minimum value of said specific node from said plurality of said static timing analysis datasets, calculating a difference between said maximum value and said minimum value, saving said difference in said multipass dataset, and repeating the aforesaid four steps for each node in said datasets;

displaying said multipass dataset;

identifying at least one marginal node of said schematic to change based in part on said multipass dataset; and making at least one change to said schematic representation to effect a change in said at least one marginal node.

* * * * *